United States Patent
Gendron et al.

(10) Patent No.: US 8,982,516 B2
(45) Date of Patent: Mar. 17, 2015

(54) AREA-EFFICIENT HIGH VOLTAGE BIPOLAR-BASED ESD PROTECTION TARGETING NARROW DESIGN WINDOWS

(71) Applicants: Amaury Gendron, San Jose, CA (US); Chai Ean Gill, Chandler, AZ (US); Vadim A. Kushner, Palos Verdes Estates, CA (US); Rouying Zhan, Gilbert, AZ (US)

(72) Inventors: Amaury Gendron, San Jose, CA (US); Chai Ean Gill, Chandler, AZ (US); Vadim A. Kushner, Palos Verdes Estates, CA (US); Rouying Zhan, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 129 days.

(21) Appl. No.: 13/750,057

(22) Filed: Jan. 25, 2013

(65) Prior Publication Data

US 2014/0211346 A1     Jul. 31, 2014

(51) Int. Cl.
*H02H 9/00* (2006.01)
*H02H 9/04* (2006.01)

(52) U.S. Cl.
CPC .................... *H02H 9/046* (2013.01)
USPC ......................................................... 361/56

(58) Field of Classification Search
USPC ......................................................... 361/56
See application file for complete search history.

(56) References Cited

U.S. PATENT DOCUMENTS

| | | | |
|---|---|---|---|
| 5,359,211 A | 10/1994 | Croft | |
| 5,530,612 A | 6/1996 | Maloney | |
| 5,576,557 A | 11/1996 | Ker et al. | |
| 5,751,042 A * | 5/1998 | Yu | 257/360 |
| 5,932,915 A * | 8/1999 | Park | 257/355 |
| 6,011,681 A | 1/2000 | Ker et al. | |
| 6,882,011 B1 * | 4/2005 | Chen | 257/355 |

(Continued)

FOREIGN PATENT DOCUMENTS

EP    1255301 A1    11/2002

OTHER PUBLICATIONS

V.A. Vaschenko et al., Implementation of Dual-Direction SCR Devices in Analog CMOS Process, 29th Electrical Overstress/Electrostatic Discharge Symposium, 2007, EOS/ESD Symposium 07-75, EOS/ESD, Sep. 16-21, 2007.

(Continued)

*Primary Examiner* — Stephen W Jackson
(74) *Attorney, Agent, or Firm* — Terrile, Cannatti, Chambers & Holland, LLP; Michael Rocco Cannatti

(57) ABSTRACT

An area-efficient, high voltage, single polarity ESD protection device (300) is provided which includes an p-type substrate (303); a first p-well (308-1) formed in the substrate and sized to contain n+ and p+ contact regions (310, 312) that are connected to a cathode terminal; a second, separate p-well (308-2) formed in the substrate and sized to contain only a p+ contact region (311) that is connected to an anode terminal; and an electrically floating n-type isolation structure (304, 306, 307-2) formed in the substrate to surround and separate the first and second semiconductor regions. When a positive voltage exceeding a triggering voltage level is applied to the cathode and anode terminals, the ESD protection device triggers an inherent thyristor into a snap-back mode to provide a low impedance path through the structure for discharging the ESD current.

20 Claims, 3 Drawing Sheets

(56) References Cited

U.S. PATENT DOCUMENTS

| | | |
|---|---|---|
| 7,327,541 B1 | 2/2008 | Wang et al. |
| 7,659,558 B1 | 2/2010 | Walker et al. |
| 7,768,068 B1 | 8/2010 | Jang et al. |
| 7,936,020 B1 * | 5/2011 | Wang et al. .................. 257/355 |
| 2008/0203534 A1 | 8/2008 | Xu et al. |
| 2009/0057833 A1 | 3/2009 | Renaud et al. |
| 2009/0195944 A1 | 8/2009 | Goyal et al. |
| 2009/0213506 A1 | 8/2009 | Zhan et al. |
| 2009/0273867 A1 | 11/2009 | Whitfield et al. |
| 2010/0019341 A1 | 1/2010 | Gill et al. |
| 2010/0127305 A1 | 5/2010 | Renaud et al. |
| 2011/0176243 A1 | 7/2011 | Zhan et al. |
| 2011/0176244 A1 | 7/2011 | Gendron et al. |

OTHER PUBLICATIONS

Search Report for EP Application No. 11185418.8 dated Jan. 24, 2012.

* cited by examiner

AREA-EFFICIENT HIGH VOLTAGE BIPOLAR-BASED ESD PROTECTION TARGETING NARROW DESIGN WINDOWS

CROSS-REFERENCE TO RELATED APPLICATIONS

This application is a divisional of co-pending application No. 12/944,931, filed Nov. 12, 2010, which is incorporated herein by reference in its entirety.

BACKGROUND OF THE INVENTION

1. Field of the Invention

The present invention is directed in general to integrated circuit devices and methods for manufacturing same. In one aspect, the present invention relates to the manufacture and use of semiconductor devices used for electrostatic discharge (ESD) protection in integrated and other circuits.

2. Description of the Related Art

To protect against electrostatic discharge (ESD) events in integrated circuit devices, ESD clamp circuits are typically provided as voltage limiting devices across the inputs and/or other terminals of such integrated circuit devices. Conventional approaches for designing ESD clamp circuits include using bipolar transistors and/or silicon controlled rectifier circuits (a.k.a., thyristor circuits) between the protected terminals which turn "on" at a triggering threshold voltage Vt and conduct current when voltage across the protected terminals rises beyond a predetermined triggering threshold voltage or limit. In operation, as the voltage applied to the terminals is increased, very little current flows through the ESD clamp circuit until the triggering threshold voltage Vt is reached, at which point the ESD clamp circuit begins conducting current up to a holding point (defined by a higher holding current $I_H$ and lower holding voltage $V_H$) after which, depending upon the internal on-state resistance $R_{ON}$ of ESD claim circuit, the current and voltage may further increase to breakdown point beyond which destructive failure may occur leading to further current increase accompanied by voltage decrease.

With advanced smart power technologies, ESD designers confront increasingly narrow design windows which define the voltage range between a low limit (set by the protection latch-up to be smaller than the holding voltage $V_H$) and a high limit (set by the breakdown point for the circuit being protected). As the design windows shrink, there are design tradeoffs between the on-state resistance $R_{ON}$, the tuning of the triggering threshold voltage Vt and holding voltage $V_H$ for the ESD clamp, and the size of the ESD clamp. These design tradeoffs can be exacerbated with ESD clamp circuits that are designed to protect against both positive and negative voltage fluctuations. For example, it is desirable to keep the on-state resistance $R_{ON}$ low so that the on-state voltage stretch-out does not lead to the degradation of the protected circuit, while the triggering threshold voltage Vt and holding voltage $V_H$ must be tuned to activate the ESD clamp under relatively high voltage conditions that effectively increase the on-resistance, which is undesirable. In many cases, the only way to get a low enough on-state resistance $R_{ON}$ is to increase the size of the ESD protection circuit, thereby increasing chip cost.

Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description is considered in conjunction with the following drawings, in which.

Figure 1:
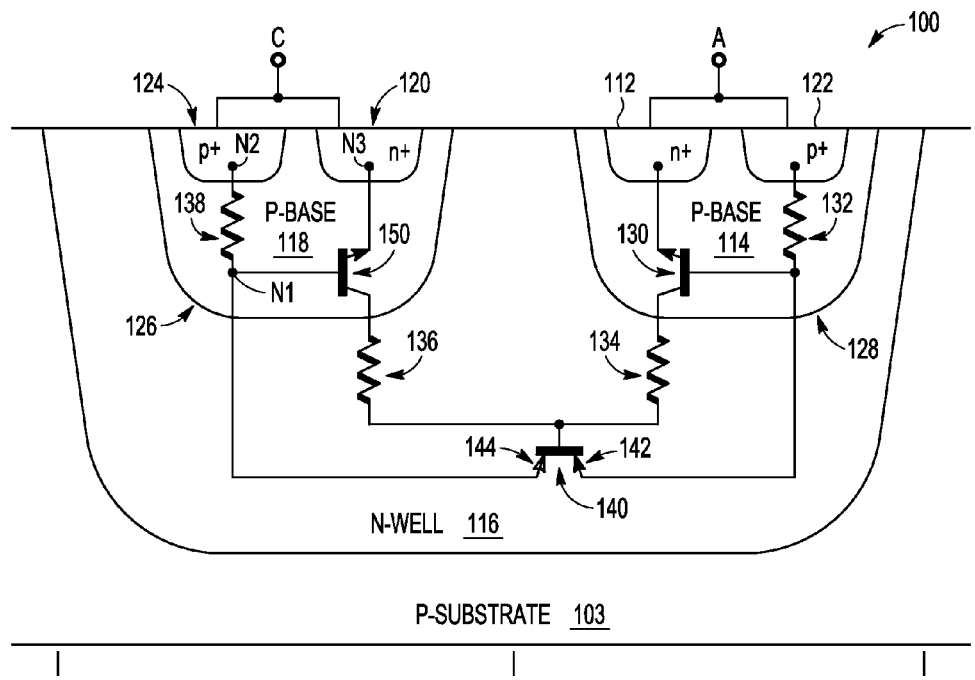
FIG. 1 is a partial cross-sectional view of a dual polarity ESD protection device having symmetrical low and top stages.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

A need exists for improved high voltage protection circuits and fabrication processes that protect electronic circuits against voltage fluctuations without a degradation of other important device properties to overcome the problems in the art. Accordingly, a high voltage, bipolar-based ESD protection device is described as being formed by a compact arrangement of semiconductor regions in a low stage and top stage to provide protection against single polarity ESD voltage events. The low stage is formed in an n-type semiconductor region or well, acting as npn transistor collector and pnp transistor base, and includes a p-type region or well, acting as npn transistor base and pnp transistor collector, in which is formed an n-type region, acting as NPN transistor emitter, and a p-type region for base ohmic contact which are both electrically connected to a first or cathode terminal. The top stage is separately formed in the n-type semiconductor region or well, acting as npn transistor collector and pnp transistor base, and includes a p-type region or well, acting as pnp transistor emitter, in which is formed only a p-type region which is electrically connected to a second or anode terminal. When the first and second terminals of the ESD protection device are subjected to an ESD voltage, the device goes into operation by triggering an inherent thyristor into a snap-back mode that provides a low impedance path through the device for discharging the ESD current. The disclosed ESD protection device is optimized specifically for single polarity protection to provide very high ESD performance (in terms of current capability, latch-up immunity, EMC immunity, etc.), low on-state resistance $R_{ON}$, and a very compact footprint.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. Such descriptions and representations are used by those skilled in the art to describe and convey the substance of their work to others skilled in the art. In addition, although specific example materials are described herein, those skilled in the art will recognize that other materials with similar properties can be substituted without loss of function. It is also noted that, throughout this detailed description, certain materials will be formed and removed to fabricate the semiconductor structure. Where the specific procedures for forming or removing such materials are not detailed below, conventional techniques to one skilled in the art for growing, depositing, removing or otherwise forming such layers at appropriate thicknesses shall be intended. Such details are well known and not considered necessary to teach one skilled in the art of how to make or use the present invention.

FIG. 1 is a partial cross-sectional view of a dual polarity ESD protection device 100 having a symmetric low stage 101 and top stage 102 fabricated in a substrate 103 using BiCMOS process technology. P-base 114 is formed in the N-well 116 to define a p-n junction 128 and to surround the n+ region 112 and p+ region 122 so that the p-base 114 is disposed between n+ region 112 and N-well 116. Similarly, p-base 118 is formed separately in the N-well 116 to define a p-n junction 126 and to surround the p+ region 124 and the n+ region 120 so that the p-base 118 is disposed between n+ region 120 and N-well 116. The anode terminal A is formed in electrical contact with n+ region 112 and p+ region 122, and the cathode terminal C is formed in electrical contact with n+ region 120 and p+ region 124. The resulting structure 100 operates without regard to the polarity of an ESD pulse appearing across its two terminals A and C. To illustrate the circuit functionality, FIG. 1 shows a circuit schematic superimposed on the cross-sectional view of the dual polarity ESD protection device 100. In the top stage 102, the n+ region 112, p-base 114, and n-well 116 form the emitter, base, and collector regions, respectively, of npn bipolar transistor 130. In similar fashion, the low stage 101 includes the n+ region 120, p-base 118, and n-well 116 which together form the emitter, base and collector regions, respectively, of npn bipolar transistor 150. In addition, a pnp bipolar transistor 140 is formed to include a base region (N-well 116) and emitter and collector regions (p-base 118 and p-base 114), depending on the polarity of the voltage or current pulse. Resistor 132 represents the resistance of the p-base 114 disposed between p+ region 122 and N-well 116. Resistor 134 represents the resistance of the N-well region 116 located across the base region of transistor 140 and the collector region of transistor 130, while resistor 136 represents the resistance of the n-well region 116 located across the base region of transistor 140 and the collector region of transistor 150. Finally, resistor 138 represents the resistance of the p-base 118 disposed between p+ region 124 and N-well 116.

As will be appreciated, the ESD protection device 100 operates to provide dual-polarity ESD protection to protect a circuit against both positive and negative voltage or current pulses when the circuit and the ESD protection device 100 are connected in parallel between first and second voltage references (e.g., Vdd and Vss) such that the A terminal is connected to the first voltage reference (e.g., Vdd) and the C terminal is connected to the second voltage reference (e.g., Vss). If a positive voltage or current pulse is applied across terminals A and C (such that the more positive voltage is applied at terminal A with respect to terminal C), pnp transistor 140 and npn transistor 150 turn ON while npn transistor 130 remains OFF, in which case the p-base 118 forms the collector region of pnp transistor 140, N-well 116 forms the base region of pnp transistor 140, and p-base 114 forms the emitter region of pnp transistor 140, as shown by solid arrow 142. Conversely, if a negative voltage or current pulse is applied across terminals A and C, the pnp transistor 140 and npn transistor 130 both turn ON while npn transistor 150 remains OFF. In this mode, p-base 114 forms the collector region of pnp transistor 140, N-well 116 forms the base region of pnp transistor 140, and p-base 118 forms the emitter region of pnp transistor 140, as shown by hollow arrow 144.

While the dual polarity ESD protection device 100 has very high ESD robustness and low on-state resistance $R_{ON}$, there are device features which are used with only one of the polarity events and which can be removed to provide a single polarity ESD protection with a smaller footprint. For example, the n+ region 112 in the top stage 102 acts as the emitter for the NPN transistor 130 when activated by negative or reverse voltage pulses, but the NPN transistor 130 otherwise remains turned OFF, meaning that the n+ region 112 is not needed for protecting against positive voltage or current pulses. Accordingly, Applicants have described, with reference to FIG. 2, a partial cross-sectional view of a single polarity ESD protection device 200 having low on-resistance, reduced footprint, and uncompromised ESD performance. As depicted, the single polarity ESD protection device 200 may be fabricated using a standard BiCMOS process technology to form an N-well 216 in a p-type substrate 203. First and second p-wells 214, 218 are formed in separate regions of the N-well 216 so that the N-well 216 is disposed between and around the first and second p-wells 214, 218. The first p-well 214 is formed to define a p-n junction 228, and includes a p+ region 222 formed so that the P-well 214 is disposed to surround the p+ region 222. Similarly, the second p-well 218 is formed to define a p-n junction 226, and includes a p+ region 224 and n+ region 220 that are formed in separate regions of the p-well 218 so that the p-well 218 is disposed between and around the p+ region 224 and n+ region 220. A first anode terminal A is formed in electrical contact with p+ region 222, and a second cathode terminal C is formed in electrical contact with n+ region 220 and p+ region 224.

Figure 2:
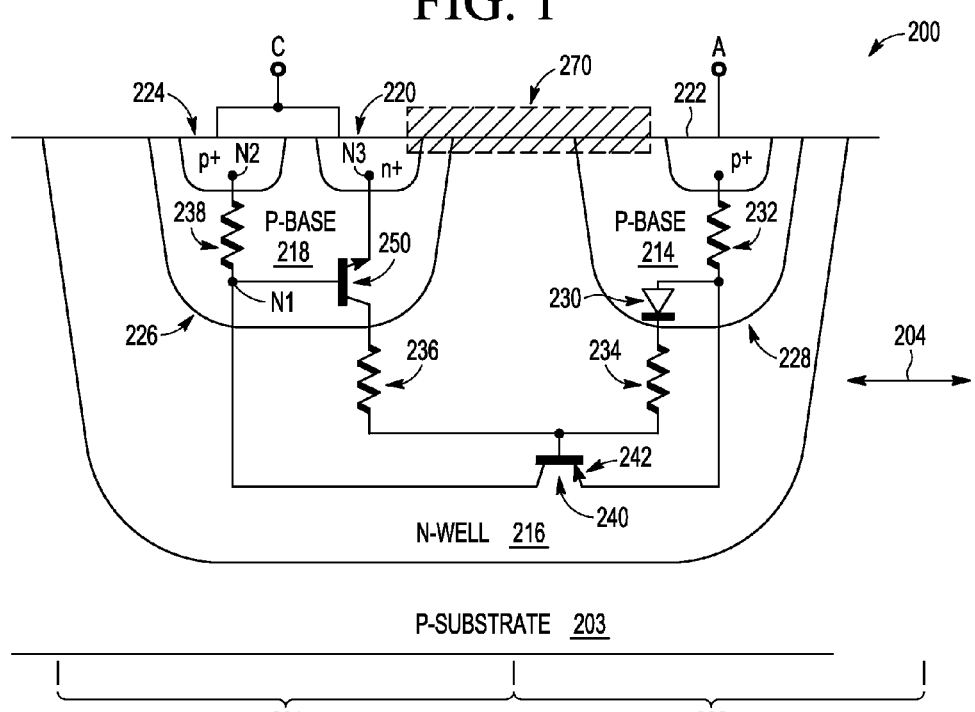
FIG. 2 is a partial cross-sectional view of a single polarity ESD protection device having low on-resistance and reduced footprint without compromised ESD performance.

Because the low stage 201 and top stage 202 are not symmetrical, the ESD protection device 200 protects only against positive polarity ESD pulses appearing across its two terminals A and C (where the more positive voltage is applied at terminal A with respect to terminal C), but does so with a smaller footprint, as indicated by the arrow 204 indicating the size savings as compared to the dual polarity ESD protection device 100. To illustrate the circuit functionality, FIG. 2 shows a superimposed circuit schematic for the single polarity ESD protection device 200. In the top stage 202, p-well 214 and n-well 216 form the p-region and n-region of the p-n diode 230. Alternatively, the p-well 214 and n-well 216 form the emitter and base regions of the pnp transistor 240 (described below), in which case the p-n diode 230 need not be separately represented. In the low stage 201, n+ region 220, p-base 218 and n-well 216 form the emitter, base and collector regions, respectively, of npn bipolar transistor 250. In addition, a pnp bipolar transistor 240 is formed to include a base region (N-well 216) and emitter and collector regions (p-base 218 and p-well 214). Resistor 232 represents the resistance of the p-well 214 disposed between p+ region 222 and N-well 216. Resistor 234 represents the resistance of the N-well region 216 located across the base region of transistor 240 and the p-type region of diode 230, while resistor 236 represents the resistance of the n-well region 216 located across the base region of transistor 240 and the collector region of transistor 250. Finally, resistor 238 represents the resistance of the p-base 218 disposed between p+ region 224 and N-well 216.

If a positive voltage or current pulse is applied across terminals A and C of the single polarity ESD protection structure 200 that exceeds a threshold voltage/current requirement, pnp transistor 240 and npn transistor 250 turn ON while p-n diode 230 is conductive. In this mode, the positive threshold voltage required to turn on the ESD device is controlled by the avalanche breakdown between the p-well 218 and n-well 216, and its value can be adjusted by including an additional n-well to reduce the distance between the p-well 218 and n-well 216. Thus activated, the p-base 218 forms the collector region of pnp transistor 240, N-well 216 forms the base region of pnp transistor 240, and p-well 214 forms the emitter region of pnp transistor 240, as shown by solid arrow 242. In this way, the transistors 240 and 250 turn ON when a positive pulse is applied across terminals A and C of the ESD protection structure 200, thereby triggering into snap-back mode the thyristor 270 defined by p-n-p-n regions 214, 216, 218 and 220.

Figure 3:
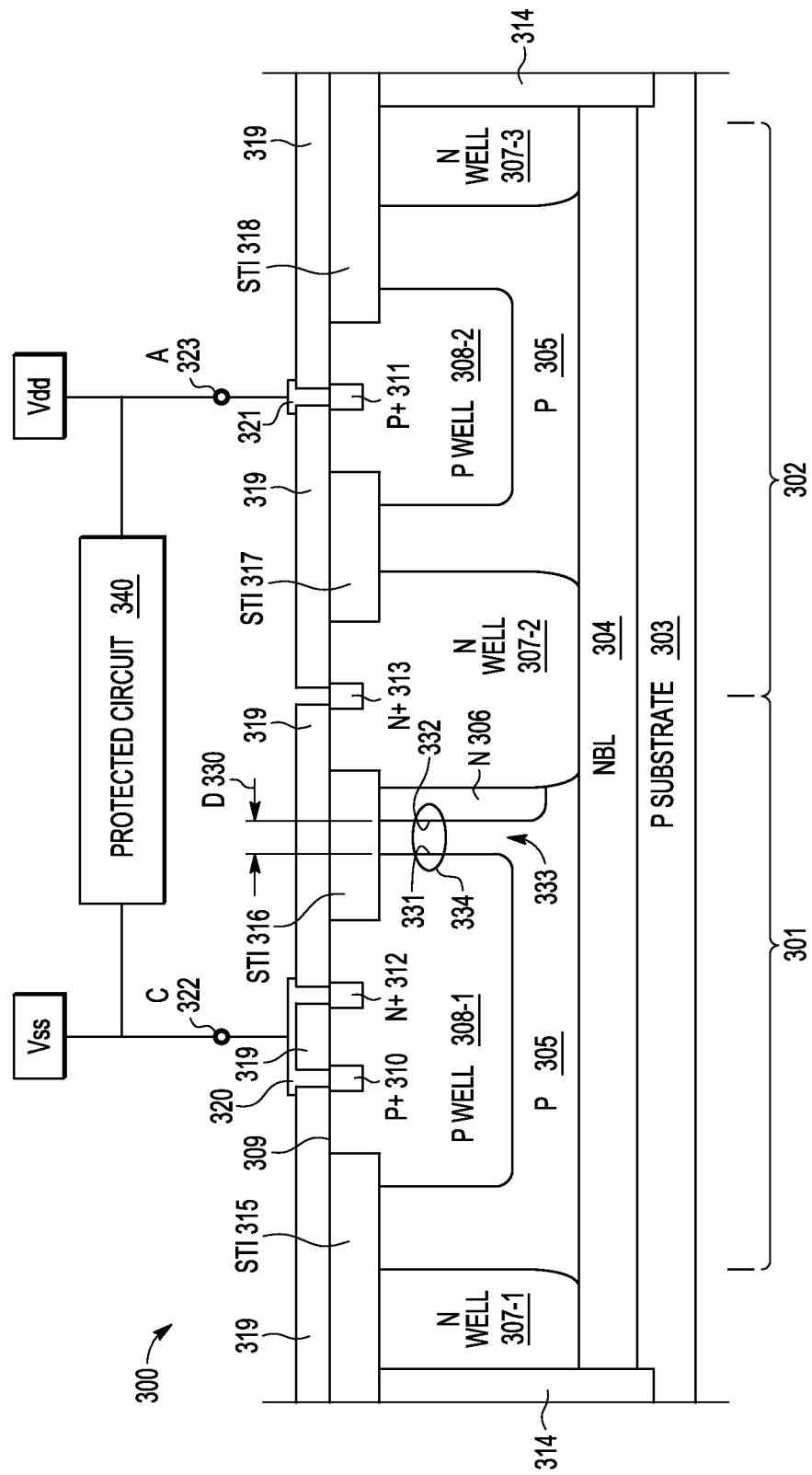
FIG. 3 is a partial cross-sectional view of an ESD protection device optimized for single polarity protection.

Turning now to FIG. 3, there is depicted a partial cross-sectional view of an area-efficient high voltage bipolar-based ESD protection device 300 that is optimized for single polarity protection and connected in parallel with a protected circuit 340 between two voltage terminals (e.g., Vdd and Vss). Though the various structures, well, and layer regions are illustrated in simplified form with straight lines and corner regions, it will be appreciated that the actual profile(s) for the different structures, well, and layer regions will not necessarily conform to simplified depictions, but will instead depend on the specific fabrication process(es) used. For example, the various well regions may have a curved junction profile reflecting the implantation and heating steps used in the formation of same. The depicted ESD protection device 300 is formed with different semiconductor materials having P-type conductivity and N-type conductivity. With the P-type materials, the dopant concentrations vary from lowest dopant concentrations (P−), higher dopant concentration (P), even higher dopant concentration (P+), and the highest dopant concentration (P++). Similarly, the dopant concentrations for the N-type materials vary from lowest dopant concentrations (N), higher dopant concentration (N+), and the highest dopant concentration for (N++).

As depicted, the ESD protection device 300 may be formed on or as part of a semiconductor substrate formed of a material having first conductivity type impurities, such as a p-type substrate layer 303, at a predetermined P− doping level (e.g., approximately $1E15$ $cm^{-3}$), though any desired dopant type and/or concentration may be used. As will be appreciated, the substrate 303 may be formed as a bulk semiconductor substrate or a semiconductor-on-insulator (SOI) type substrate in which one or more additional semiconductor layers and/or well regions are formed using epitaxial semiconductor growth and/or selective doping techniques as described more fully hereinbelow. Thus, the invention is not limited to any specific substrate type. And depending on the type of device being fabricated, the semiconductor substrate 303 may be implemented as a bulk silicon substrate, single crystalline silicon (doped or undoped), SOI substrate, or any semiconductor material including, for example, Si, SiC, SiGe, SiGeC, Ge, GaAs, InAs, InP, as well as other III/V or II/VI compound semiconductors or any combination thereof, alone or in combination with an epitaxial layer 305 (e.g., p-type epi layer). However formed, the substrate 303, alone or in combination with any additional layers or regions formed therein, has an upper surface 309 defining the uppermost extent of the substrate.

In the substrate 303/305, an isolation structure may be formed which includes an N+ buried layer 304 and a plurality of n-type sinker wells 307. The n-type sinker well(s) 307 may be formed by using a mask to selectively diffuse or implant n-type impurities into the substrate to a predetermined implant energy and dopant concentration (e.g., $1E16$ to $1E19$ $cm^{-3}$) so as to be located in an upper portion of the substrate 303/305 and at a sufficient depth to reach the N+ buried layer 304. In selected embodiments, the n-type sinker wells include one or more isolation wells 307-1, 307-3 located at the periphery of the ESD protection device 300, as well as a central n-type sinker well 307-2 which separates the ESD protection device 300 to define low stage 301 and top stage 302 portions. As for the N+ buried layer 304, a different mask and/or implant sequence is used to selectively implant n-type impurities (e.g., Antimony) into the substrate 303/305 to a predetermined implant energy and dopant concentration (e.g., $1E18$ to $1E20$ $cm^{-3}$) so as to overlap with the n-type sinker well(s) 307 and below the subsequently-formed p-well regions 308. As depicted, the floating isolation structure 304/307 is not connected to any reference potential, and separately surrounds and isolates both the low stage 301 and the top stage 302 during normal operation of the ESD protection device 300. As will be appreciated, the N+ buried layer 304 may be a buried layer, epitaxial layer or any N-type layer formed in any manner. N+ sinker wells 307 may be implemented as a conductive sinker or in any desired manner, and in combination with N+ buried layer 304, forms an isolation tub or feature which may be used to conductively isolate the ESD protection device 300 from the rest of the integrated circuit. Additional isolation is provided by forming deep trench insulator regions 314 around the ESD protection area in the substrate 303/305 using any desired technique for etching and filling deep trench openings with one or more dielectric materials.

Above the buried layer 304, one or more semiconductor layers 305 are formed to a predetermined thickness of a material having the first conductivity type (e.g., p-type) impurities. For example, the p-type semiconductor layer(s) 305 may be formed by implanting p-type impurities into an existing semiconductor substrate layer or by growing an epitaxial p-type layer having a thickness in the range of approximately 1.5-5 um with a p-type doping concentration (e.g., approximately $1E14$ to $1E16$ $cm^{-3}$, and more preferably $1E15$ $cm^{-3}$), though other dopant types, thicknesses, and/or concentrations may be used. However formed, the doping concentration and/or epitaxial growth conditions are selected and controlled to form the p-type semiconductor layer 305 as a lightly doped p-type layer for the subsequently-formed deep n-well 306, n-well 307, and p-well 308 regions. At this stage of the process, the epitaxial p-type layer 305 may be formed over the entirety of the N+ buried layer 304 using any desired epitaxial process for growing or depositing a p-type semiconductor layer to the desired thickness and doping concentration.

In the p-type semiconductor layer 305, first and second low voltage well regions 308-1, 308-2 are formed to a predetermined depth of a material having the first conductivity type (e.g., p-type) impurities so as to be located to surround and contain each subsequently-formed terminal contact regions 310-312. For example, the first and second well regions 308-1, 308-2 may be formed as deep p-type diffusions by using a mask or other technique to selectively diffuse or implant p-type impurities using a predetermined implant energy and dopant concentration (e.g., 1E16 to 1E19 $cm^{-3}$, and more preferably 5E16 to 5E18 $cm^{-3}$, and more preferably 1E17 $cm^{-3}$) to a predetermined depth (e.g., 1.5 um), though other dopant types, depths, and/or concentrations may be used. First and second low voltage well regions 308-1, 308-2 are generally somewhat more heavily doped than p-type semiconductor layer 305. However formed, the doping concentration, implant energy, and junction depth are selected and controlled to form the p-well regions 308-1, 308-2 so that they are completely contained within the p-type semiconductor layer 305 and separately from the deep n-well 306 and n-well 307 regions.

A deep well region 306 is also formed in the p-type semiconductor layer 305 to a predetermined depth of a material having the second conductivity type (e.g., n-type) impurities so as to be located in ohmic contact with the central N-well 307-2 and spaced apart from the first p-well region 308-1. For example, the deep n-well region 306 may be formed as a deep n-type diffusion by using a mask or other technique to selectively diffuse or implant n-type impurities into the substrate 303/305 to a predetermined depth (e.g., about 0.2 to 3 microns, and more preferably at substantially the same depth as the first p-well region 308-1) using a predetermined implant energy and dopant concentration (e.g., 5E15 to 2E18 $cm^{-3}$, and more preferably 5E16 to 5E17 $cm^{-3}$), though other dopant types, thicknesses, and/or concentrations may be used. In forming the deep n-well region 306, the doping concentration, implant energy, and junction depth are selected and controlled so that the deep n-well region 306 is formed next to, but spaced apart from, the first well region 308-1 to thereby define a base-collector spacing dimension D 330 which is determined by the lateral separation between the boundary 331 of p-well (base) region 308-1 and the boundary 332 of the central N-well region 307-2. As depicted, the base-collector spacing dimension D 330 controls the avalanche breakdown region 334 which spans the portion 333 of the p-type semiconductor layer 305 between boundaries 331-332. In this way, the threshold voltage value is controlled by the avalanche breakdown between the p-well 308-1 and n-well 306, and can be adjusted by the distance D 330 between these wells 308-1 and 306.

After forming the p-well and n-well regions 306-308, a plurality of separate implant mask and implantation processes are used to form the contact region(s) 310-313, including cathode contact regions 310, 312 and anode contact region 311. For example, the n+ contact regions 312, 313 may be formed by using an implant mask (not shown) to selectively implant n-type impurities into the first low voltage p-well region 308-1 and central n-well 307-2 to a predetermined thickness (e.g., about 0.3 microns) using a predetermined implant energy and dopant concentration (e.g., 1E19-1E21 $cm^{-3}$), though other dopant types, thicknesses, and/or concentrations may be used. In similar fashion, the p+ contact regions 310, 311 may be formed by using an implant mask (not shown) to selectively implant p-type impurities into the first and second low voltage p-well regions 308-1 and 308-2 to a predetermined thickness (e.g., about 0.3 microns) using a predetermined implant energy and dopant concentration (e.g., 1E19-1E21 $cm^{-3}$), though other dopant types, thicknesses, and/or concentrations may be used.

Shallow trench isolation (STI) regions 315-318 may be formed in an upper portion of the substrate 303/305 to surround and isolate the various well regions in the ESD protection device 300. The STI regions 315-318 may be formed by selectively etching trench openings in the substrate 303/305 using an etch mask, filling the openings with appropriate isolation material(s), and then polishing or planarizing the isolation material(s) isolation down to the surface of the substrate 303/305. Though illustrated as STI regions, it will be appreciated that field oxide regions may also be used, or any other desired dielectric material which forms an electrical isolation barrier for electrically isolating the ESD protection device 300 from the rest of the integrated circuit.

During back-end processing, one or more metallization layer(s) 320-321 are formed to define first and second terminals for the ESD protection device 300. For example, after forming the contact region(s) 310-313, a dielectric or masking layer 319 is deposited, patterned and selectively etched to define openings over the contact regions 310-313. With the contact regions 310-313 exposed, a conductive layer is deposited, masked and selectively etched to form first and second conductors 320, 321. The first conductor 320 is formed to make ohmic contact to the n+ and p+ contact regions 310, 312 in the low stage 301, thereby forming a cathode terminal The same processing steps may be used to form the second conductor 321 in ohmic contact to the p+ contact region 311 in the top stage 302, thereby forming an anode terminal With the depicted ESD protection device 300, protection is provided against positive polarity ESD pulses using a standard BiCMOS process technology to fabricate an N+ isolation structure 304/307 in a p-type substrate 303/305 so as to define and isolate first and second low voltage p-wells 308-1, 308-2 in the p-type semiconductor layer 305 such that a central n-type well 307-2 is disposed between the first and second low voltage p-wells 308-1, 308-2. In the first or low stage p-well 308-1, a p+ region 310 and n+ region 312 are separately formed so that the p-well 308-1 is disposed between and around the p+ region 310 and n+ region 312. Similarly, in the second or top stage p-well 308-2, there is only a p+ region 311 formed without any accompanying n+ region, thereby reducing the device footprint. A first anode terminal A 323 is formed in electrical contact with p+ region 311, and a second cathode terminal C 322 is formed in electrical contact with p+ region 310 and n+ region 312. In this configuration, the doped n+ region 312 in the first p-well region 308-1 serves as the emitter, the p-well 308-1 serves as the base, the doped p+ region 310 serves as the base contact region, and the central n-type well 307-2 and/or N+ buried layer 304 serves as the collector for the low stage npn transistor. In addition, a pnp bipolar transistor is formed to include a base region (central n-type well 307-2 and/or N+ buried layer 304), a collector region (p-well region 308-1), and an emitter region (p-well region 308-2). The remaining circuit functionality of the ESD protection device 300 follows the description provided above with reference to FIG. 2 so that, when a positive voltage or current pulse is applied across terminals 322, 323 of the single polarity ESD protection structure 300, the pnp transistor and npn transistor turn ON, thereby triggering into snap-back mode the thyristor defined by the series connected p-region (308-2), n-region (304/307-2), p-region (308-1), and n-region (312).

Figure 4:
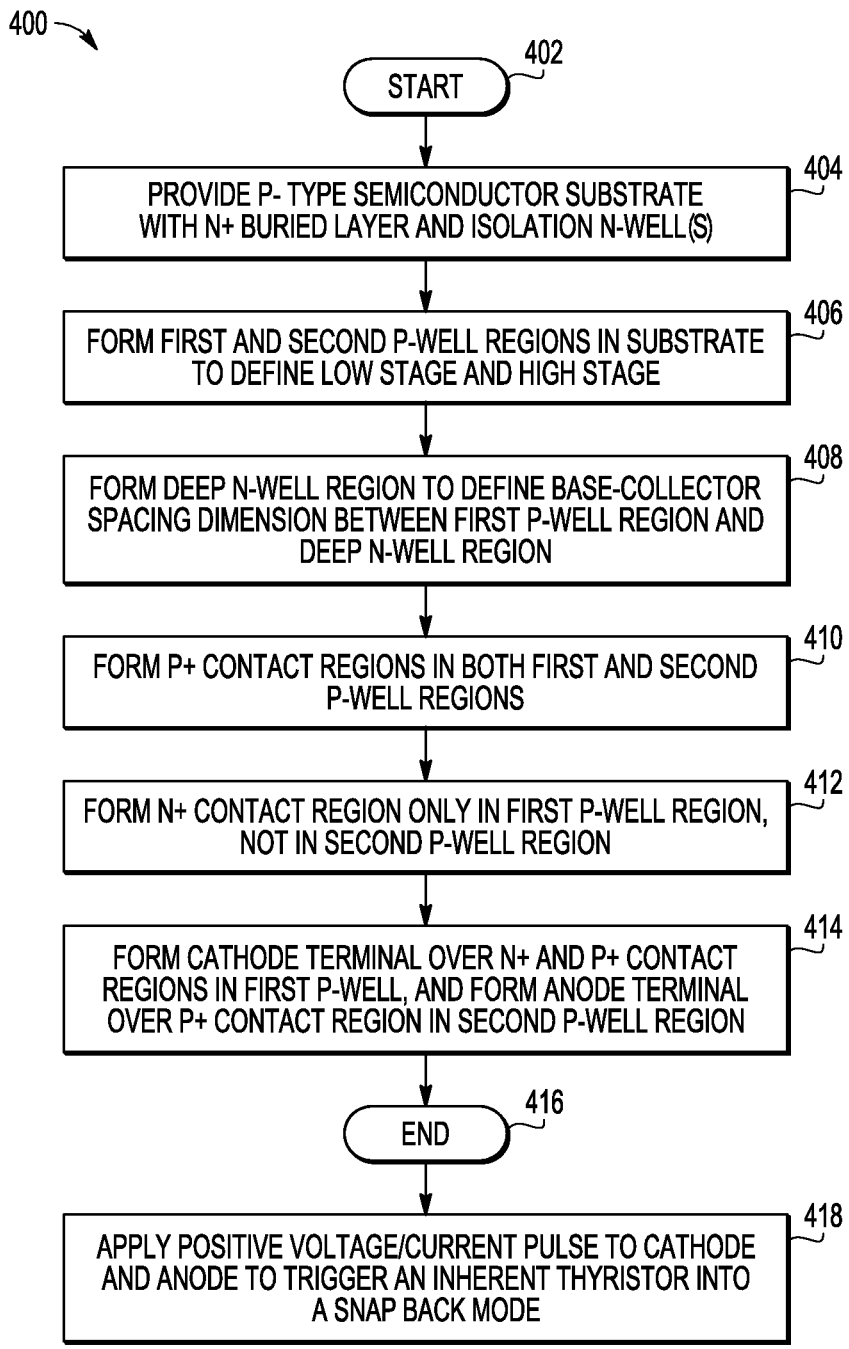
FIG. 4 is a simplified schematic flow chart illustrating various methods for fabricating devices in accordance with selected embodiments of the invention.

FIG. 4 is a simplified schematic flow chart illustrating various methods 400 for fabricating area-efficient high voltage bipolar-based ESD protection devices in accordance with selected embodiments of the invention. In describing the fabrication methodology 400, various reference numbers, doping types and concentrations are provided by way of examples of different regions that can be formed, but this is intended merely to facilitate understanding of various exemplary embodiments and not by way of limitation. Once the fabrication methodology starts (step 402), a semiconductor substrate layer is provided at step 404 which has a first conductivity type (e.g., p-type) and doping concentration (e.g., approximately 1E15 cm$^{-3}$). Unless otherwise indicated, subsequent steps may be provided in any desired order.

In the semiconductor substrate layer, an N+ buried layer and one or more isolation N-wells are formed by selectively implanting and diffusing dopants having a second conductivity type (e.g., n-type) to define and isolate first and second p-type regions in the substrate (step 404). For example, the N+ buried layer may be formed by implanting and diffusing n-type dopants into the substrate to a predetermined implant energy and dopant concentration (e.g., 1E18 to 1E20 cm$^{-3}$). In addition, the isolation N-wells may be formed by using a mask to selectively diffuse or implant n-type impurities into the substrate to a predetermined implant energy and dopant concentration (e.g., 1E16 to 1E19 cm$^{-3}$) so as extend from the surface of the substrate and down to intersect with the N+ buried layer. One of the isolation N-wells is positioned to separate the first and second p-type regions in the substrate which will define the low stage and high stage portions of the ESD protection device.

At step 406, first and second p-well regions are selectively formed in the substrate to define low stage and high stage portions of the ESD protection device that are separated by the isolation N-well. For example, the first and second p-well regions may be formed by using a mask to selectively diffuse or implant p-type impurities into the substrate using a predetermined implant energy and dopant concentration (e.g., 1E16 to 1E19 cm$^{-3}$) to a predetermined depth (e.g., 1.5 um). The first and second p-well regions are implanted into the low stage and high stage portions, respectively, of the ESD protection device At step 408, a deep n-well region is selectively formed in the substrate to define the base-collector spacing which controls the breakdown between the deep n-well region and the nearby low voltage p-well region. This spacing is used to trigger the npn bipolar transistor in the low stage of the ESD protection device. For example, the deep n-well region may be formed by using a mask to selectively diffuse or implant n-type impurities to a predetermined depth (e.g., about 0.2 to 3 um) using a predetermined implant energy and dopant concentration (e.g., in the range of approximately 5E15 to 2E18 cm$^{-3}$).

At step 410, the p+ contact regions are formed in the first and second p-well regions, such as by using a mask to selectively diffuse or implant p-type impurities to form shallow, highly doped p-type diffusion. The p+ contacts may be formed at the same time as the p-type source/drain regions are formed.

At step 412, the n+ contact regions are formed only in the first p-well region, thereby reducing the area requirements for the second p-well region. The n+ contact region may be formed by using a mask to selectively diffuse or implant n-type impurities to form shallow, highly doped n-type diffusion. The n+ contact may be formed at the same time as the n-type source/drain regions are formed.

At step 414, a metallization or terminal electrode may be formed over the n+ and p+ contact regions in the first p-well region, thereby forming the cathode terminal At the same time, a metallization or terminal electrode may be formed over the p+ contact region in the second p-well region, thereby forming the anode terminal As depicted, the fabrication methodology 400 ends at step 416, though it will be appreciated that additional front-end and back-end processing steps (not shown) may be performed.

After fabrication of the ESD protection device, the device is activated (step 418) to provide high voltage, bipolar-based ESD protection against a single polarity voltage or current pulse that is applied to the cathode and anode terminals. In particular, a positive voltage or current pulse exceeding a triggering requirement that is applied across the cathode and anode terminals turns ON the npn transistor in the low stage that is formed by the n+ contact region in the first p-well region (emitter), the first p-well region (base), and both the N+ buried layer and the isolation N-well positioned between the first and second p-type regions (collector). At the same time, the positive voltage/current pulse turns ON the pnp transistor that is formed by the first p-well region (collector), both the N+ buried layer and the isolation N-well positioned between the first and second p-type regions (base), and the second p-well region (emitter).

By now it should be appreciated that there is provided herein an integrated circuit device and method for fabricating same. As disclosed, the integrated circuit device includes a circuit and a single polarity bipolar transistor electrostatic discharge (ESD) clamp coupled in parallel between first and second terminals. The ESD clamp includes a substrate region of a first conductivity type (e.g., p-type); a first semiconductor region of the first conductivity type (e.g., a heavily doped p-well formed in a lighter doped p-type epitaxial layer) formed at the surface of the substrate; a second semiconductor region of the first conductivity type (e.g., a heavily doped p-well formed in a lighter doped p-type epitaxial layer) formed at the surface of the substrate and separated from the first semiconductor region; and an electrically floating third semiconductor region of the second conductivity type (e.g., n-type) opposite from the first conductivity type formed in the substrate to surround and separate the first and second semiconductor regions. In the first semiconductor region, there is formed a first contact region of the first conductivity type connected to the first terminal and a second contact region of the second conductivity type connected to the first terminal. In the second semiconductor region, there is formed a third contact region of the first conductivity type connected to the second terminal and no additional contact region of the second conductivity type connected to the second terminal Thus, the first semiconductor region is sized at a first relatively larger area to accommodate both the first and second contact regions, while the second semiconductor region is sized at a second relatively smaller area to accommodate only the third contact region. The electrically floating third semiconductor region may include a heavily doped n-type well formed at the surface of the substrate to separate the first and second semiconductor regions; a heavily doped n-type buried layer formed below the first and second semiconductor regions and in ohmic contact with the heavily doped n-type well; and/or an n-well region formed at the surface of the substrate in ohmic contact with the heavily doped n-type well and separated from the first semiconductor region by a spacing dimension which controls an avalanche breakdown region between the first semiconductor region and the n-well region. When the first terminal is electrically coupled to a ground reference potential and the second terminal is electrically coupled to a node in the circuit that is to be protected against a voltage exceeding a trigger voltage value, the current associated with the voltage automatically flows through the single polarity bipolar transistor ESD clamp when the voltage is placed across the first and second terminals.

In another form, there is provided a method of fabricating a semiconductor device. In the disclosed methodology, first and second p-type regions (e.g., p-wells, alone or in combination with a p-type epi layer) are formed at a surface of a substrate to be spaced apart from one another by at least a portion of an n-type semiconductor region so that the first p-type region has a larger area than the second p-type region at the surface of the n-type semiconductor region. In selected embodiments, the n-type semiconductor region is formed as an electrically floating n-type semiconductor region which surrounds and separates the first and second p-type regions, such as by forming a heavily doped n-type well at the surface of the substrate and in ohmic contact with a heavily doped n-type buried layer below the first and second p-type regions. In other embodiments, the electrically floating semiconductor region is formed with an n-well region at the surface of the substrate in ohmic contact with the heavily doped n-type well and separated from the first region by a spacing dimension which controls an avalanche breakdown region between the first region and the n-well region. Subsequently, first and second p-type contact regions are formed in each of the first and second p-type regions, respectively. In addition, a third n-type contact region is formed in only the first region but not in the second region. Subsequently, first and second terminals are formed such that the first terminal is in electrical contact with the first and third contact regions, and the second terminal is in electrical contact with the second contact region, thereby forming a single polarity bipolar transistor electrostatic discharge (ESD) clamp coupled between the first and second terminals.

In yet other embodiments, there is disclosed a method and system for providing ESD protection. As disclosed, an electrostatic discharge (ESD) protection structure is provided in an integrated circuit formed from a semiconductor body having a substrate region of a first conductivity type. As formed, the provided ESD protection structure includes a first semiconductor region of the first conductivity type in which is formed a first contact region of the first conductivity type and a second contact region of a second, opposite conductivity type, where the first and second contact regions are connected to a first grounded terminal and where the first semiconductor region is sized to contain the first and second contact regions. The ESD protection structure also includes a second semiconductor region of the first conductivity type in which is formed a third contact region of a first conductivity type without including any contact region of the second conductivity type, where the third contact region is connected to a second terminal and where the second semiconductor region is sized to contain the third contact region but not any additional contact region. In addition, the ESD protection structure includes an electrically floating third semiconductor region of the second conductivity type continuous with the first and second semiconductor regions so as to surround and separate the first and second semiconductor regions. When a positive voltage is applied between the second terminal and the first grounded terminal of the integrated circuit that has a magnitude greater than a trigger value, an npn transistor (formed by the second contact region, the first semiconductor region, and the electrically floating third semiconductor region) turns ON and also a pnp transistor (formed by the second semiconductor region, the electrically floating third semiconductor region, and the first semiconductor region) turns ON, thereby enabling current flow through the ESD protection structure substantially only when the voltage across the first and second terminals exceeds the trigger value. As will be appreciated, the voltage arises from ESD between the first and second terminals, and causes the ESD protection structure to enter a snap-back condition when the magnitude of the voltage across the first and second terminals becomes greater than the trigger value.

Although the described exemplary embodiments disclosed herein are directed to area-efficient, high voltage, single polarity ESD protection devices target for narrow design windows and methods for making same, the present invention is not necessarily limited to the example embodiments which illustrate inventive aspects of the present invention that are applicable to a wide variety of transistor fabrication processes and/or structures. Thus, the particular embodiments disclosed above are illustrative only and should not be taken as limitations upon the present invention, as the invention may be modified and practiced in different but equivalent manners apparent to those skilled in the art having the benefit of the teachings herein. For example, while the various devices illustrated herein are described with reference to a p-type substrate, this is merely for convenience of explanation and not intended to be limiting and persons of skill in the art will understand that the principles taught herein apply to devices of either conductivity type. Accordingly, the identification of particular regions as N-type or P-type is merely by way of illustration and not limitation and opposite conductivity type regions may be substituted in order to form devices of opposite conductivity type. Moreover, the thicknesses and doping concentrations of the described layers may deviate from the disclosed ranges or values. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method comprising:
   providing an electrostatic discharge (ESD) protection structure in an integrated circuit formed from a semiconductor body having a substrate region of a first conductivity type wherein the ESD protection structure comprises:
   (a) a first semiconductor region of the first conductivity type in which is formed a first contact region of the first conductivity type and a second contact region of a second, opposite conductivity type, where the first and second contact regions are connected to a first grounded terminal and where the first semiconductor region is sized to contain the first and second contact regions;
   (b) a second semiconductor region of the first conductivity type in which is formed a third contact region of a first conductivity type without including any contact region of the second conductivity type, where the third contact region is connected to a second terminal and where the second semiconductor region is sized to contain the third contact region but not any additional contact region; and
   (c) an electrically floating third semiconductor region of the second conductivity type continuous with the first and second semiconductor regions so as to surround and separate the first and second semiconductor regions; and
   applying a positive voltage between the second terminal and the first grounded terminal of the integrated circuit.

2. The method of claim 1, where the voltage arises from ESD between the first and second terminals.

3. The method of claim 1, where the ESD protection structure enters a snap-back condition when the magnitude of the voltage across the first and second terminals becomes greater than the trigger value.

4. The method of claim 1, where the positive voltage has a magnitude greater than a trigger value such that the voltage turns ON an npn transistor formed by the second contact region, the first semiconductor region, and the electrically floating third semiconductor region, and also turns ON a pnp transistor formed by the second semiconductor region, the electrically floating third semiconductor region, and the first semiconductor region, thereby enabling current flow through the ESD protection structure substantially only when the voltage across the first and second terminals exceeds the trigger value.

5. The method of claim 1, where providing the ESD protection structure comprises providing a single polarity ESD clamp coupled between the first grounded terminal and the second terminal of the integrated circuit.

6. The method of claim 1, where the first and second semiconductor regions of the first conductivity type are formed separately in the substrate region to be surrounded and separated by the electrically floating third semiconductor region of the second conductivity type such that the first semiconductor region includes the first and second contact regions of different conductivity types while the second semiconductor region includes only the third contact region of the first conductivity type with no additional contact region of the second conductivity type.

7. The method of claim 1, where the first conductivity type is p-type, and the second conductivity type is n-type.

8. The method of claim 1, where the first and second semiconductor regions each comprise a heavily doped p-well formed at the surface of the substrate region.

9. The method of claim 1, where the first and second semiconductor regions each comprise a heavily doped p-well formed in a p-type epitaxial layer having relatively lighter doping.

10. The method of claim 1, where the electrically floating third semiconductor region comprises a heavily doped n-type well formed at the surface of the substrate region to separate the first and second semiconductor regions.

11. The method of claim 10, where the electrically floating third semiconductor region comprises a heavily doped n-type buried layer formed below the first and second semiconductor regions and in ohmic contact with the heavily doped n-type well.

12. The method of claim 10, where the electrically floating third semiconductor region comprises an n-well region formed at the surface of the substrate region in ohmic contact with the heavily doped n-type well and separated from the first semiconductor region by a spacing dimension which controls an avalanche breakdown region between the first semiconductor region and the n-well region.

13. The method of claim 1, where applying the positive voltage between the second terminal and the first grounded terminal of the integrated circuit comprises electrically coupling the first grounded terminal to a ground reference potential and electrically coupling the second terminal to a node in a circuit that is to be protected against a voltage exceeding a trigger voltage value such that current associated with the voltage automatically flows through the ESD protection structure when the voltage exceeding the trigger voltage value is placed across the first grounded terminal and second terminal.

14. The method of claim 1, where the first semiconductor region is sized at a first relatively larger area to accommodate both the first and second contact regions, while the second semiconductor region is sized at a second relatively smaller area to accommodate only the third contact region.

15. The method of claim 1, where the ESD protection structure comprises a single polarity ESD protection structure in which there are no additional contact regions for any terminal in the ESD protection structure.

16. A method for fabricating a single polarity bipolar-based electrostatic discharge protection semiconductor device, comprising:

forming separate asymmetric low and top ESD stages in an n-type semiconductor region formed in a p-type substrate, where the low ESD stage includes a p-type contact region and an n-type contact region formed in a first p-type well and electrically connected by a first grounded terminal to a ground reference potential, and where the top ESD stage includes only a p-type contact region formed in a second p-type well and electrically connected to a node in a circuit that is to be protected against a single polarity voltage exceeding a trigger voltage value.

17. The method of claim 16, where the first p-type well is sized at a first relatively larger area, while the second p-type well is sized at a second relatively smaller area to accommodate only the p-type contact region formed in a second p-type well.

18. The method of claim 16, further comprising applying a positive voltage between the node in the circuit that is to be protected and the first grounded terminal to trigger an inherent thyristor formed from the low and top ESD stages into a snap-back mode that provides a low impedance path through the single polarity bipolar-based electrostatic discharge protection semiconductor device for discharging the ESD current.

19. The method of claim 16, where the n-type semiconductor region forms a base of a first PNP transistor, a collector of a first NPN transistor formed in the low ESD stage, and an n-type region of a diode formed in the top ESD stage;

where the first p-type well forms a collector of the first PNP transistor and a base of the first NPN transistor formed in the low ESD stage; where the second p-type well forms an emitter of the first PNP transistor and a p-type region of the diode formed in the top ESD stage; where the n-type contact region formed in the first p-type well forms an emitter of the first NPN transistor formed in the low ESD stage; where the p-type contact region formed in the first p-type well provides ohmic contact to the first grounded terminal for the base of the first NPN transistor formed in the low ESD stage; and where the p-type contact region formed in the second p-type well provides ohmic contact to the node in the circuit that is to be protected for the emitter of the first PNP transistor and the p-type region of the diode formed in the top ESD stage.

20. The method of claim 16, where forming separate asymmetric low and top ESD stages in the n-type semiconductor region comprises forming a floating n-region between the first and second p-type wells to be separated from the first p-type well by a spacing dimension which controls an avalanche breakdown region between the first p-type well and the floating n-region.

* * * * *